United States Patent [19]
Kuroki

[11] Patent Number: 5,999,436
[45] Date of Patent: Dec. 7, 1999

[54] SEMICONDUCTOR STORAGE APPARATUS HAVING AN ACTIVATION SIGNAL GENERATING CIRCUITRY DISPOSED BOTH ON THE INSIDE AND IN BETWEEN THE SENSE AMPLIFIER AREAS

[75] Inventor: Kohichi Kuroki, Tokyo, Japan

[73] Assignee: NEC Corporation, Tokyo, Japan

[21] Appl. No.: 09/179,853

[22] Filed: Oct. 28, 1998

[30] Foreign Application Priority Data

Oct. 29, 1997 [JP] Japan .................................. 9-296790

[51] Int. Cl.⁶ ...................................................... G11C 5/02
[52] U.S. Cl. ................... 365/51; 365/63; 365/205
[58] Field of Search ............................... 365/51, 63, 205, 365/208

[56] References Cited

U.S. PATENT DOCUMENTS 5,657,265  8/1997  Yoo et al. .................................. 365/63

*Primary Examiner*—Andrew Q. Tran
*Attorney, Agent, or Firm*—Foley & Lardner

[57] ABSTRACT

A semiconductor storage apparatus is disclosed, which comprises a sense amplifier area having many sense amplifiers for amplifying information which is read from a memory cell to a digit line, each of the sense amplifiers being composed of an N-MOS transistor and a P-MOS transistor, the sense amplifier area being divided into a plurality of portions, an N-MOS transistor activation signal generating circuit for generating a signal for activating the N-MOS transistor, and a P-MOS transistor activation signal generating circuit for generating a signal for activating the P-MOS transistor, wherein one of the N-MOS transistor activation signal generating circuit and the P-MOS transistor activation signal generating circuit is disposed in a opening between the divided portions of the sense amplifier area, and wherein the other of the N-MOS transistor activation signal generating circuit and the P-MOS transistor activation signal generating circuit is disposed in the sense amplifier area adjacent to a MOS transistor which constitutes a sense amplifier.

8 Claims, 7 Drawing Sheets

SEMICONDUCTOR STORAGE APPARATUS HAVING AN ACTIVATION SIGNAL GENERATING CIRCUITRY DISPOSED BOTH ON THE INSIDE AND IN BETWEEN THE SENSE AMPLIFIER AREAS

BACKGROUND OF THE INVENTION

1. Field of the Invention

The present invention relates to a semiconductor storage apparatus and in particular, to a layout of MOS transistors which constitute a sense amplifier activation signal generating circuit.

2. Description of the Prior Art

In recent years, low-resistance metal lines disposed on multiple layers are used in semiconductor storage apparatuses. For example, in highly integrated DRAMs such as 16-M DRAMs or DRAMs of the following generations, low resistance metal lines such as aluminum lines and high-melting-point metal lines are disposed on two layers. Thus, the layout of an array area consisting of memory cells, sense amplifiers, a row decoder, a column decoder, and so forth has been improved. A first conventional layout is shown in FIG. 4.

In FIG. 4, memory cell areas 55 and sense amplifier areas 56 are alternately disposed as a major portion of array area 57. In each memory cell area 55, memory cells are disposed. In each sense amplifier area 57, sense amplifiers SA are disposed. Column decoder 51 is disposed at an edge portion of the array area 57. Column selection signals 52 that are outputted from column decoder 51 are disposed in array area 57 with metal lines disposed on a second layer (upper layer). Each of column selection signals 52 is connected to switching transistors I/O SWs of each sense amplifiers SA.

Sense amplifier activation signal generating circuits 53 are disposed in peripheral circuit area 58 that is disposed outside array area 57. Sense amplifier activation signals SAP and SAN that are output signals of each of sense amplifier activation signal generating circuits 53 are disposed in sense amplifier area 56 with metal lines disposed on a first layer (lower layer).

In the case that a semiconductor storage apparatus is laid out with two layers of low resistance metal lines, the thickness of the lower metal wring layer for the sense amplifier activation signals SAP and SAN should be decreased in order to flatten a base insulation film of metal lines for column selection signals 52 disposed on the upper layer. For example, when the film thickness of the upper metal lines is 1 μm, the film thickness of the lower metal lines should be around 0.5 μm. Thus, the stray resistance of the lower metal lines increases.

The sense amplifier activation signals SAP and SAN are connected to many sense amplifiers SA (around 1024 sense amplifiers SA for a 16-M DRAM). When a sense amplifier is operated, a large current flows. Thus, when the stray resistance increases, the charging/discharging capacity of the sense amplifiers SA degrades, whereby the high speed operation and stable operation of the sense amplifiers SA are adversely affected.

In order to solve such a problem, the width of lines for sense amplifier activation signals SAP and SAN is increased. In this case, the size of the sense amplifier becomes large and thus the size of the semiconductor chip becomes large. In the latest DRAM (for example, a 64-M DRAM), around 34 sense amplifier areas 56 are disposed in a row. Thus, the increased size of one sense amplifier is multiplied by 34 times for the size of a semiconductor chip.

In another conventional layout, a sense amplifier activation signal generating circuit is divided into a plurality of portions and disposed in the vicinity of sense amplifiers. Thus, the number of sense amplifiers connected to each sense amplifier activation signal is decreased so that the amount of charging/discharging current is decreased. In addition, the length of lines is decreased so as to decrease the stray resistance of the lines.

FIG. 5 is a schematic diagram showing a second conventional layout in which a sense amplifier activation signal generating circuit is disposed in a sense amplifier area (for example, ESSCC PROCEEDINGS, PP. 41–44, 1993).

In FIG. 5, MOS transistors 31 and 32 which constitute a sense amplifier activation signal generating circuit are provided for four sense amplifiers SA and disposed adjacent to four sense amplifiers SA. The sources of MOS transistors 31 and 32 are connected to metal lines 39a and 39b that are a ground line and a power line disposed on the upper layer, respectively. Metal lines 39a and 39b are alternately disposed among column selection signals 39c to 39f in parallel.

In such a layout, since MOS transistors 31 and 32 of the sense amplifier activation signal generating circuit activate only four sense amplifiers SA, the width of lines connected to the sense amplifiers SA can be decreased. In addition, since the sources of MOS transistors 31 and 32 are connected to metal lines on the thick upper layer in a short distance, the charging/discharging capacity can be increased.

However, when such a layout is used, since MOS transistors 31 and 32 that generate sense amplifier activation signals should be added, the area of sense amplifier area 33 is increased.

Estimating the increase for a 64-M DRAM, the size of each sense amplifier is increased by 7 μm. Thus, the size of the longer side of the semiconductor chip is increased by a total of 238 μm.

In order to prevent the increase of the size of each sense amplifier, a third conventional layout has been proposed. In the third layout, a sense amplifier activation signal generating circuit is disposed in a position different from the position in the first solution.

In recent years, in order to decrease the resistance of word lines, DRAMS have low resistance metal lines disposed in parallel with the word lines and connected at predetermined intervals, for example every 32 sense amplifiers, with the word lines in a memory cell area. Thus, since the connection area has a certain opening, the sense amplifier area also has a certain opening.

In a highly integrated storage apparatus such as 64-M DRAMs or DRAMs of the following generations, a word line is hierarchically selected. A word line selecting circuit is disposed at a connected portion of a word line with a metal line. In this case, there is an opening between adjacent sense amplifier areas. In addition, the opening is larger than the mere connected portion which was explained above.

In the third conventional layout, a sense amplifier activation signal generating circuit is disposed in the opening in the sense amplifier areas.

FIG. 6 is a schematic diagram showing the structure of such a DRAM.

In FIG. 6, in order to decrease the resistance of lead lines, MOS transistors 41 and 42 that constitute a sense amplifier activation signal generating circuit are disposed in a connected area of a word line with a low resistance metal line or an opening area 48 which is between sense amplifiers SA and is adjacent to areas 46 of a word line selecting circuit. The sources of MOS transistors 41 and 42 are connected to ground line 49b and power line 49a, respectively. Ground line 49a and power line 49b are disposed in parallel with column selection signals 49c to 49f and in opening 48 between sense amplifier area 43.

However, in this case, power line 49b and ground line 49a cannot be disposed with a sufficient width. In other words, when opening area 48 is disposed adjacent to the connected portion of the word line and the low resistance metal line, the width of opening area 48 is as small as several μm. On the other hand, when opening area 48 is disposed adjacent to word line selecting circuits 46, the width of opening area 48 is around 20 to 30 μm. However, since a signal line for selecting a word line is also disposed, the area remained for power line 49b and ground line 49a becomes small.

A fourth conventional layout in which a power line and a ground line are alternately disposed between column selection signal lines, which is similar to the first solution shown in FIG. 5, has been proposed (for example, ISSCC, pp. 108–109, Feb. 1991).

FIG. 7 is a schematic diagram showing the structure of such DRAM. In FIG. 7, ground line 49a and power line 49b disposed among column selection signal lines 49c to 49f are connected to MOS transistors 41 and 42 via a ground line 44c and a power line 45c disposed in sense amplifier area 43, respectively.

However, in this solution, since power line 45c and ground line 44c are disposed in sense amplifier area 43, the size of the sense amplifier is increased. In addition, since metal lines of sense amplifier area 43 are disposed on the lower layer, the thickness of the lower layer should be decreased. If the thickness is decreased, the stray resistance increases. On the other hand, when the width of the lines is increased in order to decrease the stray resistance, the size of the sense amplifier is further increased.

SUMMARY OF THE INVENTION

An object of the present invention is to provide a semiconductor storage apparatus of which the size of sense amplifiers is prevented from being increased, of which the charging/discharging capacity of the sense amplifiers is improved, and of which the sense amplifiers stably operate at high speed.

According to the present invention, there is provided a semiconductor storage apparatus, which comprises: a sense amplifier area having many sense amplifiers of which each amplifies a signal which is read from one of memory cells to a digit line, each of the sense amplifiers being composed of an N-MOS transistor and a P-MOS transistor, the sense amplifier area being divided into a plurality of portions; an N-MOS transistor activation signal generating circuit for generating a signal for activating the N-MOS transistor; and a P-MOS transistor activation signal generating circuit for generating a signal for activating the P-MOS transistor, wherein either one of the N-MOS transistor activation signal generating circuit and the P-MOS transistor activation signal generating circuit is disposed in a opening between the divided portions of the sense amplifier area, and wherein the other of the N-MOS transistor activation signal generating circuit and the P-MOS transistor activation signal generating circuit is disposed in the sense amplifier area adjacent to a MOS transistor which constitutes a sense amplifier.

The activation signal generating circuit adjacent to a MOS transistor which constitutes a sense amplifier may be disposed corresponding to a predetermined number of sense amplifiers.

The area between the divided portions of the sense amplifier area may be disposed adjacent to an area in which a metal line disposed in parallel with a word line and a word line are connected at predetermined intervals.

The area between the divided portions of the sense amplifier may be disposed adjacent to an area in which a circuit for selecting and driving a word line is disposed.

These and other objects, features and advantages of the present invention will become more apparent in light of the following detailed description of best mode embodiments thereof, as illustrated in the accompanying drawings.

DESCRIPTION OF PREFERRED EMBODIMENTS

Next, with reference to the accompanying drawings, embodiments of the present invention will be explained.

Figure 1:
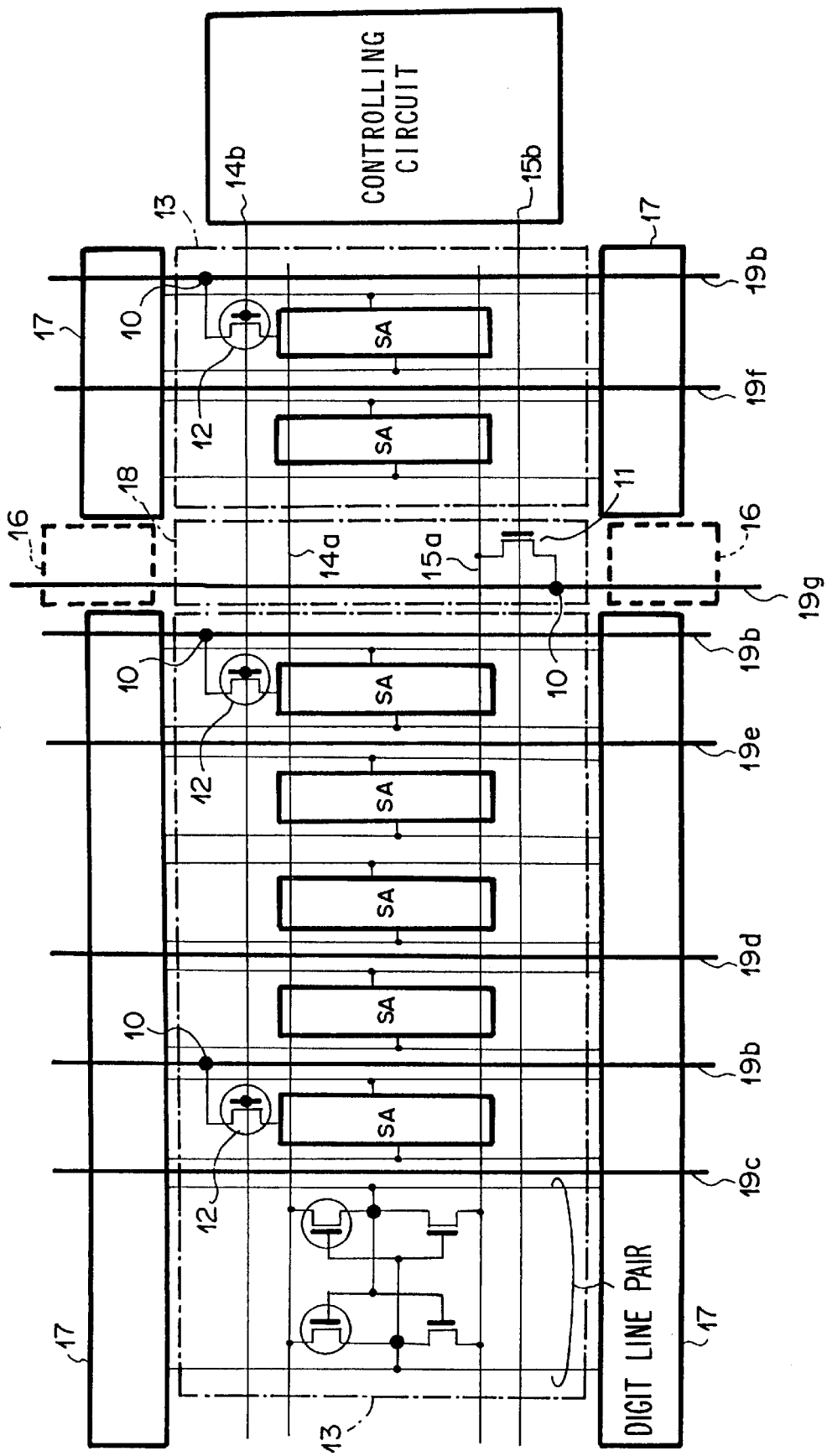
FIG. 1 is a schematic diagram showing a layout of a first embodiment of the present invention.

FIG. 1 is a schematic diagram showing a layout of a first embodiment of the present invention.

In FIG. 1, in order to decrease the resistance of a word line, N-MOS transistor activation signal generating circuit 11 that constitutes a sense amplifier is disposed in a connected area of the word line with a low-resistance metal line or opening 18 between sense amplifier areas 13 and adjacent to an areas 16 of a word line selecting circuit.

A ground line connected to the source of N-MOS transistor activation signal generating circuit 11 is connected to a ground line 19g that is a metal line disposed on the upper layer of area 16 via through-hole 10.

On the other hand, P-MOS transistor activation signal generating circuit 12 that constitutes the sense amplifier is disposed in a divided sense amplifier area 13. A power line connected to the source of P-MOS transistor activation signal generating circuit 12 is connected to power line 19b that is a metal line disposed on the upper layer of memory cell 17 via through-hole 10.

Figure 5:
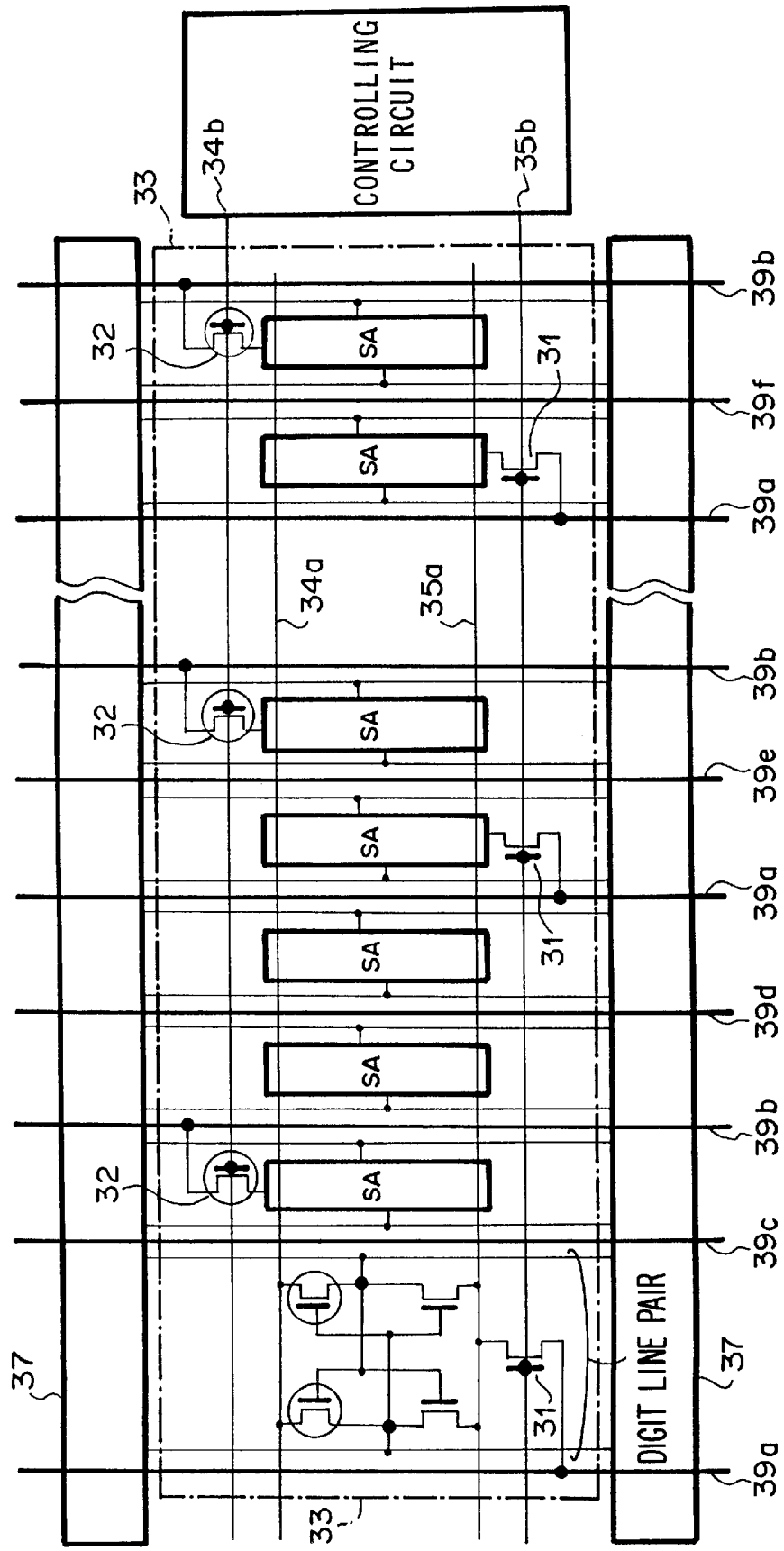
FIG. 5 is a schematic diagram showing a layout of a second conventional semiconductor storage apparatus.
Figure 6:
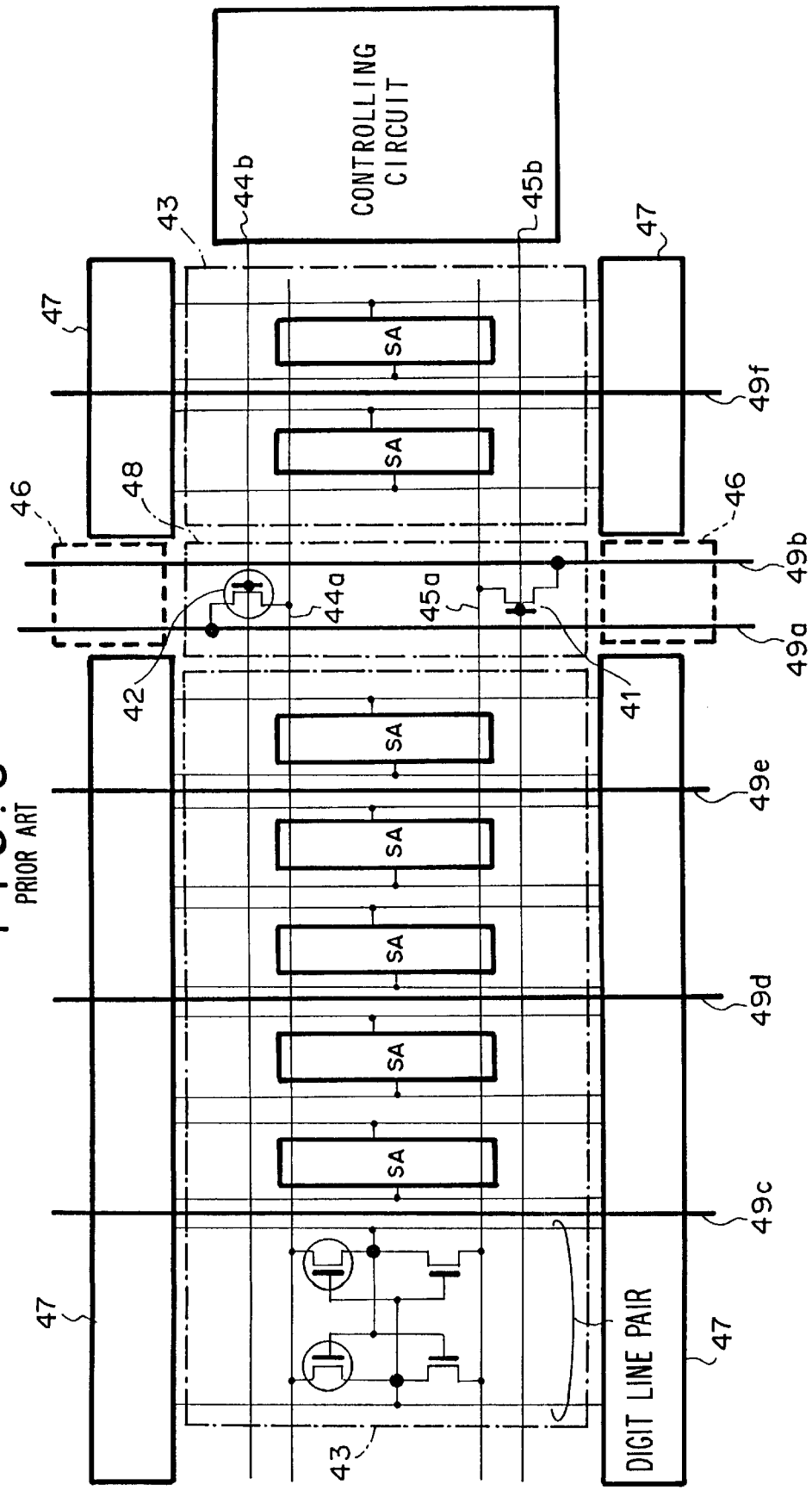
FIG. 6 is a schematic diagram showing a layout of a third conventional semiconductor storage apparatus.
Figure 7:
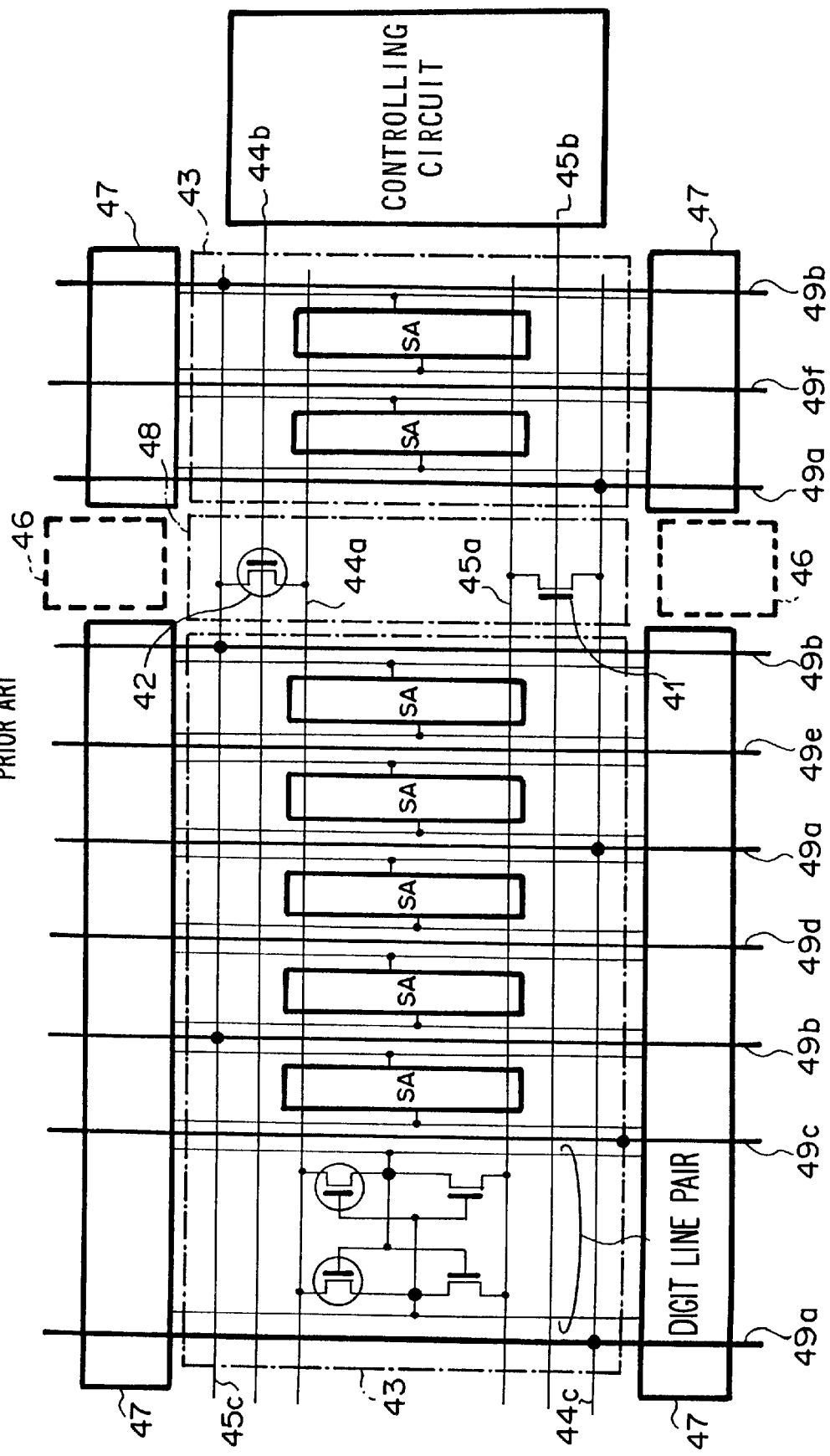
FIG. 7 is a schematic diagram showing a layout of a fourth conventional semiconductor storage apparatus.

In such a layout, only one type of transistor that is a P-MOS transistor is disposed in sense amplifier area 13. Thus, the size of the sense amplifier can be decreased in comparison with the conventional layout shown in FIG. 5. In addition, since only one type of transistor that is an N-MOS transistor is disposed in area 18, only a ground line connected to the source of the transistor is disposed in area 16. Thus, the width of lines can be increased in comparison with the conventional layout shown in FIG. 6. Consequently, the influence of the wiring resistance can be suppressed.

Next, a second embodiment of the present invention will be explained.

Figure 2:
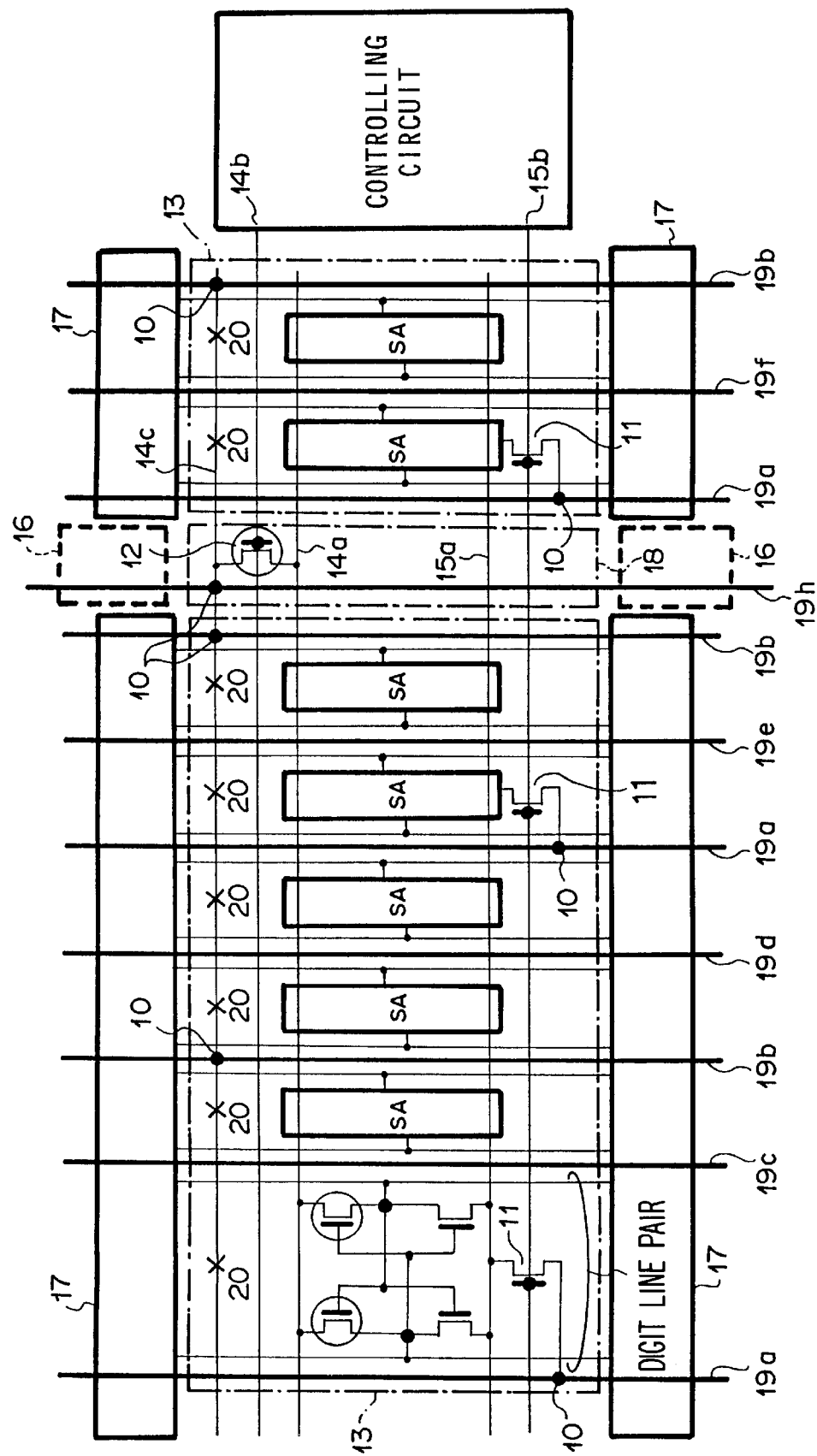
FIG. 2 s a schematic diagram showing a layout of a second embodiment of the present invention.

FIG. 2 is a schematic diagram showing a layout of the second embodiment of the present invention.

On the contrary to the first embodiment, according to the second embodiment shown in FIG. 2, P-MOS transistor activation signal generating circuit 12 that constitutes a sense amplifier is disposed in opening 18 between sense amplifier areas 13 and N-MOS transistor activation signal generating circuit 11 that constitutes the sense amplifier 13 is disposed in a divided amplifier area 13. In order to decrease the resistance of a word line, the source of P-MOS transistor activation signal generating circuit 12 is connected to metal line 19h as a power line disposed on the connected area of the word line with a low-resistance metal line or on area 16 of word line selecting circuit.

On the other hand, the source of N-MOS transistor activation signal generating circuit 11 is connected to metal line 19a as a ground line on the upper layer disposed on memory cell 17 via through-hole 10.

In order to reinforce a power line connected to the source of P-MOS transistor activation signal generating circuit 12, metal line 19b disposed on the upper layer of memory cell 17 and metal line 14c disposed on the lower layer thereof are connected each other via through-hole 10. Metal line 14c disposed on the lower layer is connected to an N type well area (not shown) of the P-MOS transistor that constitutes the sense amplifier via contact-hole 20. In addition, metal line 14c is connected to the source of activation signal generating circuit 12.

Thus, the power line connected to the source of P-MOS transistor activation signal generating circuit 12 can be disposed in a lattice shape in the array area without need to dispose a new line in sense amplifier area 13. Thus, the charging capacity can be improved.

In other words, in case that an activation signal generating circuit for either one of the N-MOS transistor and the P-MOS transistor that constitute a sense amplifier is disposed corresponding to four sense amplifiers in the sense amplifier area, while an activation signal generating circuit for the other transistor is disposed corresponding to 32 sense amplifiers in the opening between the sense amplifier areas, the activation signal generating circuit disposed in the opening between the sense amplifier areas should charge electricity to and discharge electricity from 32 sense amplifiers. Thus, unless the width of the line connected to the source of the transistor is larger than that of the activation signal generating circuit disposed in the sense amplifier area, the stray resistance of the line adversely affects the operation of the sense amplifier.

Thus, the charging/discharging capacity of the line connected to the source of the transistor disposed in the opening between the sense amplifier areas should be improved.

Most of DRAMs of these days are composed of P type semiconductors and a P-MOS transistor that constitutes a sense amplifier is disposed in an N type well. In this case, in order to supply a voltage to the N type well, a line having the voltage of the power supply is disposed along the N type well area.

According to the second embodiment of the present invention, the power line for the N type well is used to reinforce the power line of the P-MOS transistor activation signal generating circuit.

Figure 3:
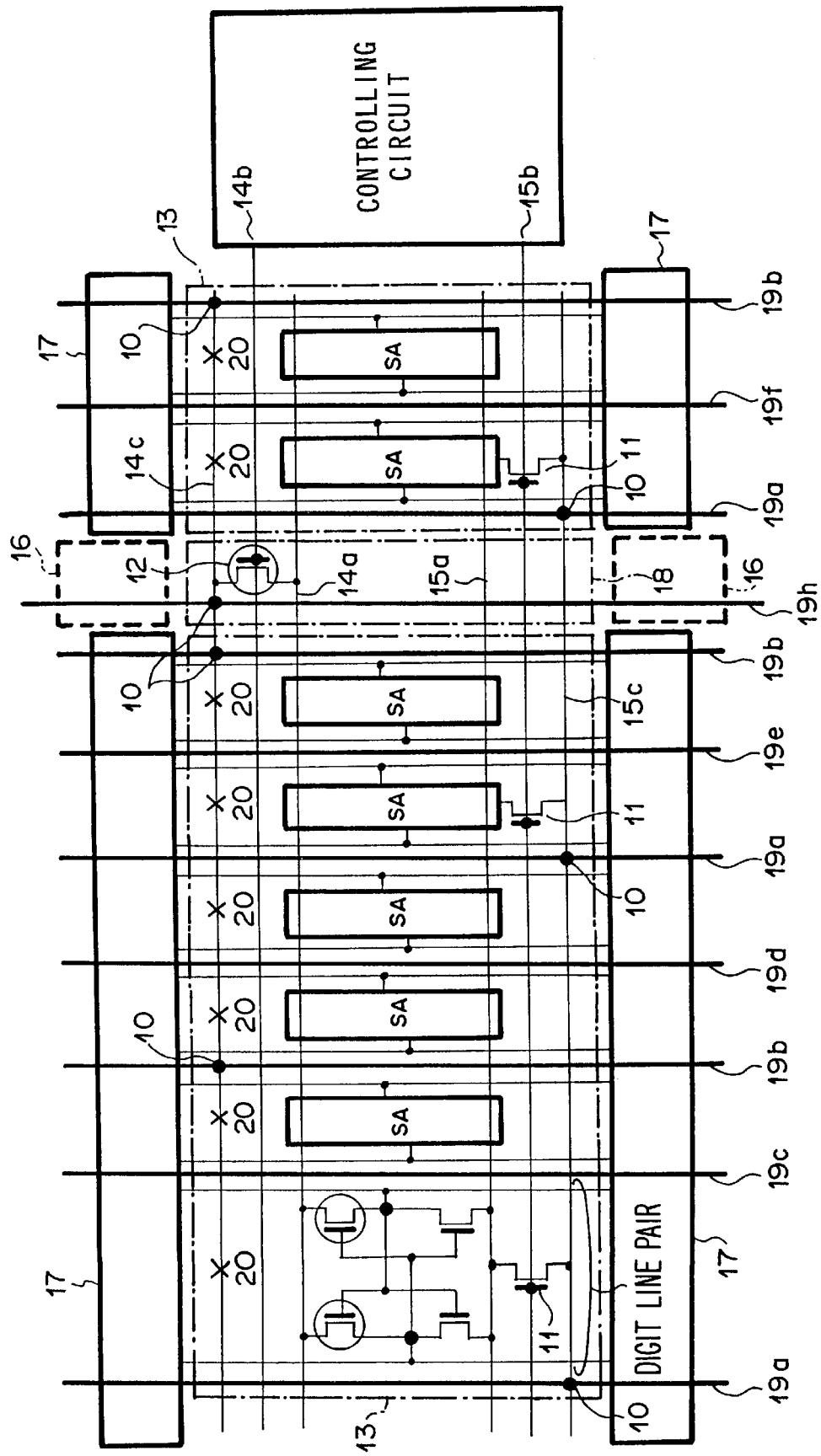
FIG. 3 is a schematic diagram showing a layout of a third embodiment of the present invention.
Figure 4:
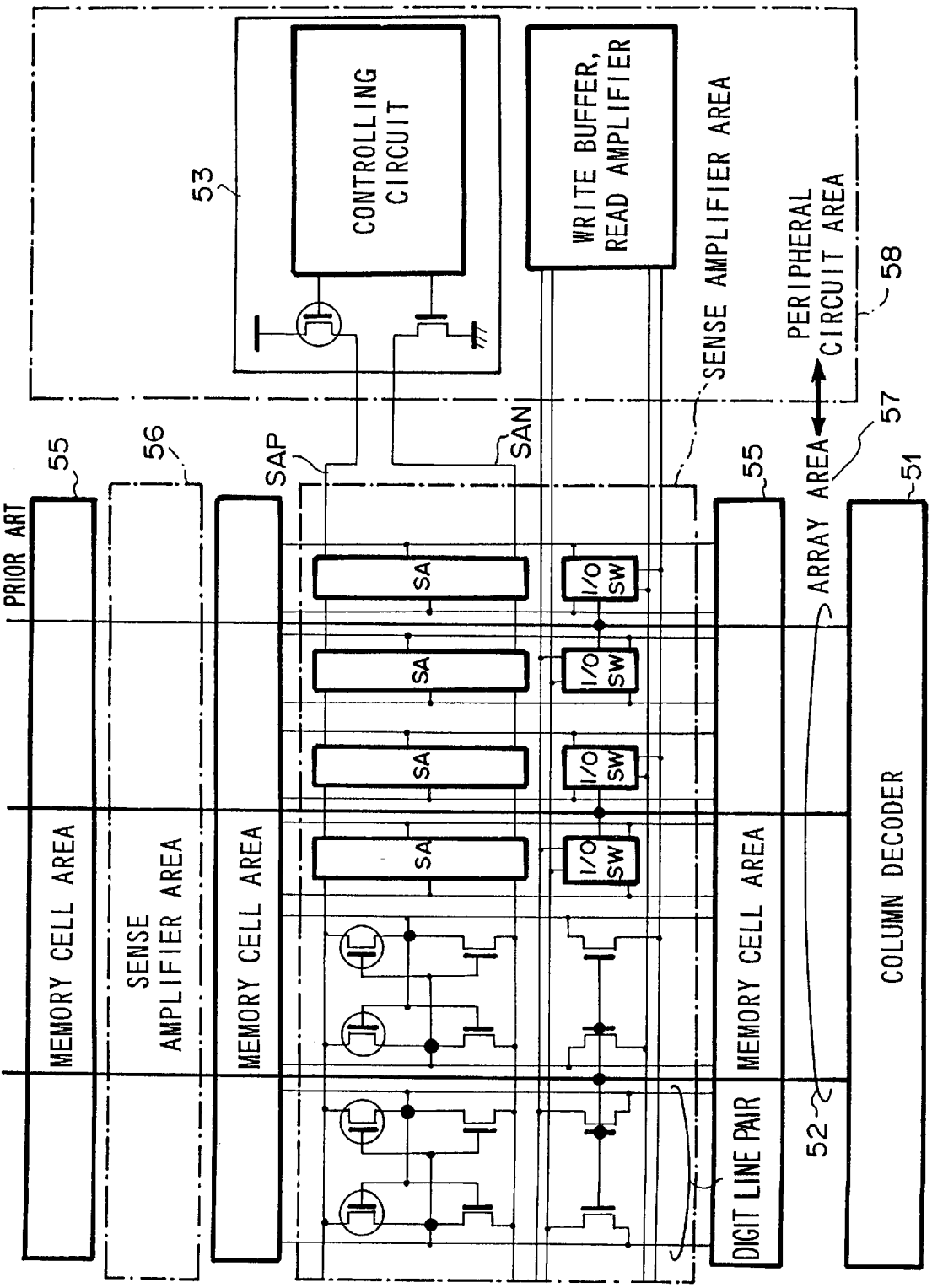
FIG. 4 is a schematic diagram showing a layout of a first conventional semiconductor storage apparatus.

FIG. 3 shows another example.

In the example shown in FIG. 3, metal line 15c is disposed on a lower layer of sense amplifier area 13. Metal line 15c is connected as a ground line to metal line 19a disposed on the upper layer thereof and the source of transistor 11. Thus, the ground line can be disposed in a lattice shape in an array area. Consequently, the discharging capacity can be further improved. In this case, similarly to the first embodiment, an N-MOS transistor activation signal generating circuit 12 that constitutes a sense amplifier can be disposed in opening 18 between sense amplifier areas 13. However, when the ground line is reinforced, the size of the sense amplifier is increased. Therefore, the advantages and disadvantages such as the increase in size should be compared in order to determine whether the reinforcement should be executed.

As a first effect of the present invention, the resistance of a power line and ground line connected to the source of the transistor that constitutes the sense amplifier activation signal generating circuit can be decreased because either one of an N-MOS transistor activation signal generating circuit and a P-MOS transistor activation signal generating circuit that constitute a sense amplifier is disposed in an area between divided portions of a sense amplifier area, while the other activation signal generating circuit is disposed adjacent to a MOS transistor that constitutes the sense amplifier. Consequently, the charging/discharging capacity of the sense amplifier activation signal generating circuit can be improved.

The reason is explained as follows: In order to decrease the resistance of a word line, one of an N-MOS transistor activation signal generating circuit and a P-MOS transistor activation signal generating circuit that constitute a sense amplifier is disposed in a connected area of a lead line with a low resistance metal line or an area between divided portions of a opening amplifier area adjacent to a opening area for a word line selecting circuit. Thus, only one of a power line and a ground line must be disposed in the opening area.

As a second effect, the power line can be disposed in a lattice shape in an array area because a power line connected to the source of a P-MOS transistor activation signal generating circuit that constitutes a sense amplifier is used in common with a power line for supplying a power voltage to an N type well in which a P-MOS transistor that constitutes the sense amplifier is disposed. Thus, the charging capacity can be improved.

Although the present invention has been shown and explained with respect to the best mode embodiments thereof, it should be understood by those skilled in the art that the foregoing and various other changes, omissions, and additions in the form and detail thereof may be made therein without departing from the spirit and scope of the present invention.

What is claimed is:

1. A semiconductor storage apparatus, comprises:
 a sense amplifier area having a plurality of sense amplifiers each amplifies a signal which is read from one of memory cells to a digit line, each of said sense amplifiers being composed of an N-MOS transistor and a P-MOS transistor, said sense amplifier area being divided into a plurality of portions;
 an N-MOS transistor activation signal generating circuit generating a first signal for activating the N-MOS transistor; and
 a P-MOS transistor activation signal generating circuit generating a second signal for activating the P-MOS transistor,
 wherein either one of said N-MOS transistor activation signal generating circuit and said P-MOS transistor activation signal generating circuit is disposed in an opening area between the divided portions of said sense amplifier area, and
 wherein the other of said N-MOS transistor activation signal generating circuit and said P-MOS transistor activation signal generating circuit is disposed in said sense amplifier area adjacent to a MOS transistor which constitutes a sense amplifier.

2. The semiconductor storage apparatus as set forth in claim 1, wherein said activation signal generating circuit adjacent to a MOS transistor which constitutes a sense amplifier is disposed corresponding to a predetermined number of sense amplifiers.

3. The semiconductor storage apparatus as set forth in claim 1, wherein said opening area between the divided portions of said sense amplifier area is disposed adjacent to an area in which a metal line is disposed in parallel with a word line and the word lines are connected at predetermined intervals.

4. The semiconductor storage apparatus as set forth in claim 3, wherein said activation signal generating circuit adjacent to a MOS transistor which constitutes a sense amplifier is disposed corresponding to a predetermined number of sense amplifiers.

5. The semiconductor storage apparatus as set forth in claim 1, wherein said opening area between the divided portions of said sense amplifier area is disposed adjacent to an area in which a circuit for selecting and driving a word line is disposed.

6. The semiconductor storage apparatus as set forth in claim 5, wherein said activation signal generating circuit adjacent to a MOS transistor which constitutes a sense amplifier is disposed corresponding to a predetermined number of sense amplifiers.

7. The semiconductor storage apparatus as set forth in claim 1, wherein said N-MOS transistor activation signal generating circuit is disposed in the opening area between the divided portions of said sense amplifier area, and wherein said P-MOS transistor activation signal generating circuit is disposed in said sense amplifier area adjacent to a MOS transistor which constitutes a sense amplifier.

8. The semiconductor storage apparatus as set forth in claim 1, wherein said N-MOS transistor activation signal generating circuit is disposed in said sense amplifier area adjacent to a MOS transistor which constitutes a sense amplifier, and wherein said P-MOS transistor activation signal generating circuit is disposed in the opening area between the divided portions of said sense amplifier area.

* * * * *